United States Patent [19]

Seliger

[11] 4,101,782

[45] Jul. 18, 1978

[54] PROCESS FOR MAKING PATTERNS IN RESIST AND FOR MAKING ION ABSORPTION MASKS USEFUL THEREWITH

[75] Inventor: Robert L. Seliger, Agoura, Calif.

[73] Assignee: Hughes Aircraft Company, Culver City, Calif.

[21] Appl. No.: 794,288

[22] Filed: May 5, 1977

Related U.S. Application Data

[63] Continuation of Ser. No. 626,425, Oct. 28, 1975, abandoned.

[51] Int. Cl.$^2$ .............................................. B05D 3/06
[52] U.S. Cl. .................................. 250/492 B; 427/36; 427/38; 427/54; 427/259
[58] Field of Search ...................... 427/43, 44; 96/35.1, 96/36.2; 156/7, 22; 250/492 B

[56] References Cited

U.S. PATENT DOCUMENTS 3,529,960  9/1970  Sloan ........................................ 96/36

OTHER PUBLICATIONS

Basious, p. 4210, IBM Tech. Dis. Bull., vol. 18, No. 12 May 76.

*Primary Examiner*—Bernard D. Pianalto
*Attorney, Agent, or Firm*—William J. Bethurum; W. H. MacAllister

[57] ABSTRACT

Disclosed is a process for forming resist patterns on selected substrates and includes the steps of forming an ion absorption mask on the surface of a thin supporting membrane and thereafter aligning the mask with a substrate having a layer of resist thereon. Next, the ion absorption mask is exposed to a beam of ions which pass through certain areas of the absorption mask and into the resist layer to thereby expose selected regions in the resist layer (i.e., to increase or decrease the solubility of the resist to a chosen developer). In a specific embodiment of the invention, the ion absorption mask is formed by initially anodizing an aluminum substrate to form a thin coating of aluminum oxide thereon, and thereafter depositing a gold mask on one surface of the aluminum oxide coating. Certain regions of both the aluminum oxide coating and the aluminum substrate beneath the gold mask are removed to expose the aluminum oxide beneath the gold mask, thereby forming a thin taut aluminum oxide membrane which supports the gold ion absorption mask.

4 Claims, 7 Drawing Figures

PROCESS FOR MAKING PATTERNS IN RESIST AND FOR MAKING ION ABSORPTION MASKS USEFUL THEREWITH

This is a continuation of application Ser. No. 626,425 filed Oct. 28, 1975 and now abandoned.

FIELD OF THE INVENTION

This invention relates generally to the arts of micropattern generation and mask fabrication and more particularly to a novel ion beam lithographic process for forming resist patterns on selected substrates. The invention is also directed to a subcombination process for making hyper-thin ion absorption masks uniquely adapted for use in the proton exposure of resist layers.

BACKGROUND

In the art of photolithography which has been useful for many years in the construction of semiconductor integrated circuits and devices, ultraviolet radiation has been useful as a means for exposing and developing a variety of known and commerically avaliable photoresist materials. However, as a result of the diffraction limitations of standard photolithographic mask making processes which use ultraviolet radiation, the minimum resolution obtainable using this prior art process is about 1 micrometer.

To improve upon this resolution limitation of prior art photolithographic processes using ultraviolet radiation, two technologies have evolved. One of these technologies is known as "X-ray lithography" and is disclosed, for example, in an article by Henry I. Smith entitled "Fabrication Techniques For Surface Acoustic Wave and Thin Film Optical Devices" Proceeding of the IEEE, Vol. 62 No. 10, October, 1974, pages 1361-1387. A second technology which also involves an alternative approach to ultraviolet (UV) photolithography for mask fabrication is known as "electron projection lithography", and one process of the latter type is disclosed, for example, in U.S. Pat. No. 3,672,987 issued to T. W. O'Keeffe et al.

The above two technologies have demonstrated certain advantages over ultraviolet photolithography as a method of mask fabrication, and may in some instances overcome the diffraction limitations and resolution characteristic of UV processes. However, both the X-ray and electron projection processes are time consuming and do not readily lend themselves to large scale batch fabrication process. For example, the time required for X-rays to expose patterns in a positive resist layer is prohibitively long and may require several hours to complete. Additionally, adverse proximity effects often occur when exposing resist layers with closely spaced electron beams. Both of these latter disadvantages have been eliminated by the present invention.

THE INVENTION

One general purpose of the present invention is to introduce yet another, pattern generation process which, in certain applications, may be used instead of any of the above prior art replication processes. Furthermore, the present process is capable of producing resist patterns on selected substrates without the above difficulties of long exposure time or the proximity effects encountered in the above two prior art processes, respectively. Another general purpose of the present invention is to provide a novel ion absorption mask making process which may itself be utilized in the generic resist pattern fabrication process described herein.

To achieve the first of the above purposes, I have developed a process which involves, among other things, forming a selected ion absorption mask on the surface of a thin supporting membrane and then aligning the ion absorption mask with a substrate having a layer of resist thereon. Thereafter, ions are projected through certain areas of the ion absorption mask and into the layer of resist to expose predefined areas in the resist layer. To achieve the second general purpose above, I have developed an ion absorption mask fabrication process in which an aluminum substrate is initially anodized to form an aluminum oxide coating thereon, and thereafter a gold mask is deposited on one surface of the aluminum oxide coating. By selectively removing regions of the aluminum oxide coating and its underlying aluminum substrate beneath the gold mask, the remaining aluminum oxide layer can serve as a thin taut supporting membrane adapted to pass high enery ions through the regions thereof not covered by the gold mask.

Accordingly, it is an object of the present invention to provide a new and improved ion lithographic process for forming resist patterns on selected substrates.

Another object is to provide a process of the type described in which certain resist development steps may be carried to completion in less time than it takes to complete the corresponding resist development steps in both X-ray lithographic processes and electron projection lithographic processes.

A further object is to provide a novel process for making an ion beam absorption mask which is particularly well suited for use in the generic resist pattern forming process embodying the invention.

These and other objects and features of the invention will become more readily apparent in the following description of the accompanying drawings.

DRAWING

Figure 1:
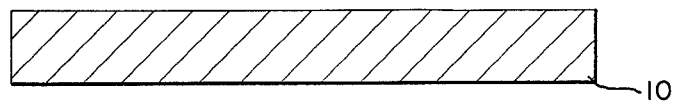
FIGS. 1 through 5 illustrate one process embodiment of the present invention which is utilized in the formation of an ion absorption mask.

Referring now in succession of FIGS. 1 through 5, there is shown in FIG. 1 an aluminum substrate or starting material 10 which is typically in the range of 5 to 20 mils in thickness, and the aluminum substrate 10 is initially cleaned and polished using standard metal processing techniques. The substrate 10 is thereafter transferred to an electrolytic bath (not shown), including an electrolyte such as ammonium citrate di-basic, through which an anodizing current is passed for a predetermined time to thereby form a thin aluminum oxide (Al$_2$O$_3$) coating over the entire front and back surface areas of the aluminum substrate 10.

Figure 2:
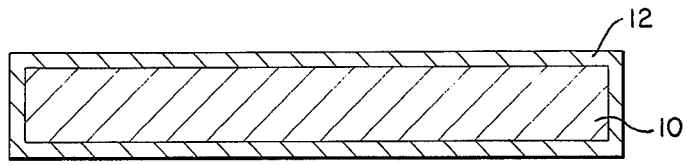
Figure 3:
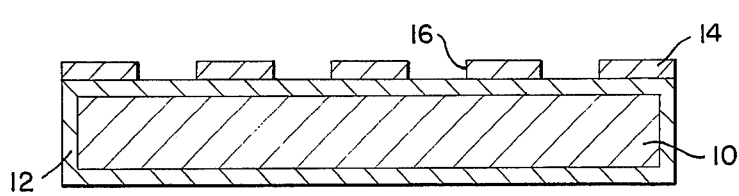

The anodized substrate 10 in FIG. 2 is then transferred to a conventional gold mask deposition station wherein conventional gold evaporation and masking techniques are utilized to form the gold mask 14 on the upper surface of the anodized coating 12. The gold mask 14 has a plurality of predefined openings 16 therein through which high energy ions may pass. The masked structure in FIG. 3 is then transferred to an ion beam machining station wherein a beam 18 of low energy ions such as argon is utilized to sputter remove a portion of the aluminum oxide coating from the backside of the Al substrate 10 in the region 20 indicated in FIG. 4. In this processing step, an ion beam machining mask (not shown) is placed over the backside of the aluminum oxide layer 12 and has an opening corresponding to opening 22 in the Al$_2$O$_3$ coating 12. Ions transmitted by the machining mask strike the Al$_2$O$_3$ coating 12 and form the opening 22 therein. Apparatus suitable for carrying out this ion beam machining step is disclosed for example in U.S. Pat. No. 3,659,510 of H. L. Garvin et al.

Figure 4:
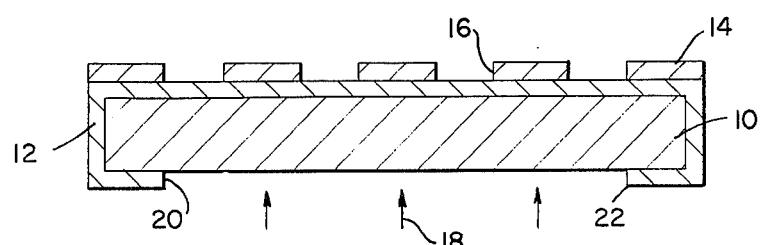
Figure 5:
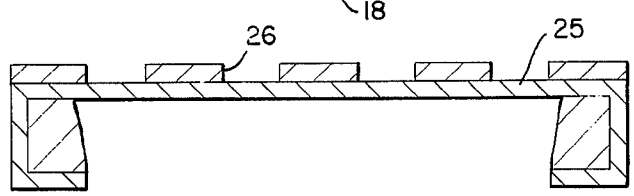

The structure of FIG. 4 is then transferred to a conventional chemical etching station wherein an etchant such as hydrochloric acid (HCl) is applied to the structure, and the HCl perferentially attacks the aluminum substrate 10 which is exposed by the opening 22 in the Al$_2$O$_3$ layer 12. After a certain time, the HCl etchant completely removes the aluminum 10 underlying the portion of the gold mask indicated in FIG. 5 to thereby leave a thin aluminum oxide membrane layer 25 on the order of 2,000 angstroms in thickness. The Al$_2$O$_3$ membrane 25 fully supports the gold mask 14 in a taut fashion, and allows ions to pass through openings 26 in the gold mask 14 when the latter is subjected to an ion beam 28 as shown in FIG. 6.

Figure 6:
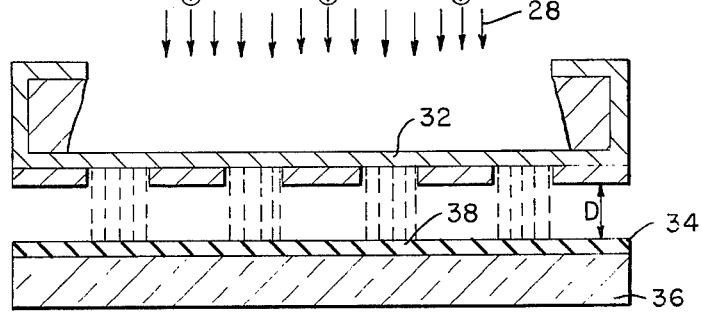
FIGS. 6 and 7 illustrate the resist pattern forming process according to the invention and utilizing the ion absorption mask of FIG. 5.
Figure 7:
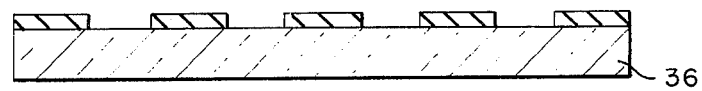

The process illustrated in FIGS. 6 and 7 is the generic resist exposure process according to the invention and includes a source of protons 30 which is positioned in an appropriate particle accelerating field which, in turn, projects these protons through the exposed areas 32 of the aluminum oxide membrane 25 and into a resist layer 34. The resist layer 34 has been previously deposited on a suitable substrate 36 and may, for example, be a commercially available polymethylmethacrylate resist (PMMA). In FIG. 6, a positive resist layer 34 is utilized, so that the areas 38 of the resist layer 34 which are bombarded by the proton beam 28 are exposed by the protons and are subsequently removable from the surface of the substrate 36 by means of a commercially available developer, such as isopropal alcohol (60%) and methyl isobutyl ketone (40%).

In a typical high resolution application of this invention used for producing 0.5 micrometer wide lines in polymethylmethacralate resist (PMMA), the following approximate parameters can be used. A 120 keV proton beam can be used to irradiate a 0.35 micrometer thick film of PMMA on a wafer, and using a dose of $1 \times 10^{13}$ ions/cm$^2$ in about 10 seconds. The proton beam current should be about 2 microamperes and the beam diameter should be about 1 centimeter. This proton beam 28 should be raster scanned over the ion absorption mask and will expose the PMMA resist at the rate of about 1 cm$^2$/sec. The ion absorption mask in FIG. 5 should comprise a 2000 Å thick Al$_2$O$_3$ membrane 25 which supports a gold film 16 of 0.25 micrometers in thickness and patterned with openings 26 that are to be replicated in positive resist layer 34. The inter mask-wafer spacing "D" in FIG. 6 should be about 25 micrometers.

The present invention is not limited by the above specific parameters and may obviously be practiced using many variations thereof. For example, other light ions, such as helium, may be used instead of protons in the formation of selected patterns in resist. Additionally, the particular particle absorption mask disclosed and claimed may be used with other particle acceleration processes, such as ion implantation doping, without departing from the true scope of the invention.

What is claimed is:

1. A process for making a charged particle absorption mask including:
    (a) providing an aluminum substrate,
    (b) anodizing a surface of said substrate to thereby form an anodized Al$_2$O$_3$ coating thereon,
    (c) depositing a gold mask on one surface of said anodized coating, and
    (d) selectively removing a region of said aluminum substrate underlying said anodized coating and said gold mask to thereby expose said anodized coating and permit same to pass accelerated particles therethrough.

2. A process for forming patterns in resist on the surface of a substrate which includes the steps of:
    (a) providing an aluminum substrate,
    (b) anodizing the surface of said substrate to thereby form a coating of Al$_2$O$_3$ thereon,
    (c) depositing a gold mask on one surface of said Al$_2$O$_3$ coating,
    (d) selectively removing regions of aluminum underlying said gold mask to thereby expose the anodized Al$_2$O$_3$ coating supporting said gold mask, whereby ions may be projected through said Al$_2$O$_3$ coating and through openings in said gold mask,
    (e) aligning said gold mask with a selected substrate having a layer of resist thereon, and
    (f) projecting ions through openings in said gold mask and into said layer of resist to thereby develop predefined areas in said layer of resist.

3. A process for making a particle absorption mask including:
    (a) providing an aluminum substrate,
    (b) anodizing a surface of said substrate to thereby form an anodized Al$_2$O$_3$ coating thereon,
    (c) depositing an ion absorption material of a chosen pattern on one surface of said anodized coating and having openings therein which allow ions to pass through said coating, and
    (d) selectively removing a region of said aluminum substrate underlying both said anodized coating and said ion absorption material to thereby expose said anodized coating and permit same to pass accelerated particles therethrough.

4. A process for forming patterns in resist on the surface of a substrate which includes the steps of:
    (a) forming an ion absorption material of a chosen pattern on the surface of a thin taut supporting membrane of aluminum oxide and having openings therein which permit ions to pass through selected areas of said aluminum oxide,
    (b) aligning said ion absorption material with a selected substrate having a layer of resist thereon, and
    (c) projecting ions through said selected areas of said aluminum oxide membrane exposed by said openings in said pattern of ion absorption material and into said layer of resist to thereby develop predefined areas in said layer of resist.

* * * * *